US008939765B2

(12) United States Patent
Kronholz et al.

(10) Patent No.: US 8,939,765 B2
(45) Date of Patent: Jan. 27, 2015

(54) REDUCTION OF DEFECT RATES IN PFET TRANSISTORS COMPRISING A SI/GE SEMICONDUCTOR MATERIAL FORMED BY EPITAXIAL GROWTH

(75) Inventors: Stephan Kronholz, Dresden (DE); Peter Javorka, Radeburg (DE); Maciej Wiatr, Dresden (DE); Roman Boschke, Dresden (DE); Christian Krueger, Liegau-Augustusbad (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1082 days.

(21) Appl. No.: 12/965,118

(22) Filed: Dec. 10, 2010

(65) Prior Publication Data

US 2011/0291163 A1    Dec. 1, 2011

(30) Foreign Application Priority Data

May 31, 2010   (DE) .......................... 10 2010 029 531

(51) Int. Cl.
*H01L 21/336*   (2006.01)
*H01L 21/8238*   (2006.01)
*H01L 29/78*   (2006.01)

(52) U.S. Cl.
CPC   *H01L 21/823807* (2013.01); *H01L 21/823814* (2013.01); *H01L 21/823864* (2013.01); *H01L 29/7843* (2013.01); *H01L 29/7848* (2013.01)
USPC ........... 433/197; 438/285; 438/289; 257/288; 257/E29.193; 257/E29.255; 257/E21.182; 257/E21.409

(58) Field of Classification Search
CPC ................... H01L 21/02381; H01L 21/02444; H01L 21/02532; H01L 21/71; H01L 29/16; H01L 21/823807; H01L 21/823814; H01L 29/7843; H01L 29/7848
USPC ........... 257/288, E29.193, E29.255, E21.182, 257/E21.409; 438/197, 285, 289
See application file for complete search history.

(56) References Cited

U.S. PATENT DOCUMENTS

| 7,608,499 | B2 | 10/2009 | Romero et al. ............... 438/199 |
| 7,755,145 | B2 * | 7/2010 | Sato et al. ...................... 257/369 |
| 2004/0256614 | A1 | 12/2004 | Ouyang et al. .................. 257/20 |

(Continued)

FOREIGN PATENT DOCUMENTS

DE   102006035666 B3   4/2008   .......... H01L 21/8234

OTHER PUBLICATIONS

Translation of Official Communication from German Patent Office for German Patent Application No. 10 2010 029 531.0 dated Jan. 20, 2011.

(Continued)

*Primary Examiner* — Colleen A Matthews
*Assistant Examiner* — Colleen E Snow
(74) *Attorney, Agent, or Firm* — Amerson Law Firm, PLLC

(57) ABSTRACT

In sophisticated semiconductor devices, the defect rate that may typically be associated with the provision of a silicon/germanium material in the active region of P-channel transistors may be significantly decreased by incorporating a carbon species prior to or during the selective epitaxial growth of the silicon/germanium material. In some embodiments, the carbon species may be incorporated during the selective growth process, while in other cases an ion implantation process may be used. In this case, superior strain conditions may also be obtained in N-channel transistors.

22 Claims, 9 Drawing Sheets

(56) References Cited

U.S. PATENT DOCUMENTS

| | | | |
|---|---|---|---|
| 2005/0164467 A1* | 7/2005 | Lim et al. | 438/400 |
| 2007/0096149 A1 | 5/2007 | Liu et al. | 257/192 |
| 2008/0191243 A1 | 8/2008 | Liu et al. | |
| 2010/0025771 A1 | 2/2010 | Hoentschel et al. | 257/369 |

OTHER PUBLICATIONS

Translation of Official Communication from German Patent Application No. 10 2010 029 531.0 dated May 2, 2014.

* cited by examiner

REDUCTION OF DEFECT RATES IN PFET TRANSISTORS COMPRISING A SI/GE SEMICONDUCTOR MATERIAL FORMED BY EPITAXIAL GROWTH

BACKGROUND OF THE INVENTION

1. Field of the Invention

Generally, the present disclosure relates to integrated circuits, and, more particularly, to transistors comprising an epitaxially grown silicon/germanium mixture in the active regions of the transistors.

2. Description of the Related Art

The fabrication of complex integrated circuits requires the provision of a large number of transistor elements, which represent the dominant circuit elements in complex integrated circuits. For example, several hundred millions of transistors may be provided in presently available complex integrated circuits, wherein performance of the transistors in the speed critical signal paths substantially determines overall performance of the integrated circuit. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface positioned between highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

Upon continuously reducing the channel length of field effect transistors, generally, an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high speed transistor elements, which may, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, other alternatives have been developed in increasing the charge carrier mobility in the channel region, thereby also enhancing overall performance of field effect transistors. One promising approach in this respect is the generation of a certain type of strain in the channel region, since the charge carrier mobility in silicon strongly depends on the strain conditions of the crystalline material. For example, for a standard crystallographic configuration of the silicon-based channel region, a compressive strain component in a P-channel transistor may result in a superior mobility of holes, thereby increasing switching speed and drive current of P-channel transistors. The desired compressive strain component may be obtained according to well-established approaches by incorporating a strain-inducing semiconductor material, for instance in the form of a silicon/germanium mixture or alloy, in the active region of the P-channel transistor. For example, after forming the gate electrode structure, corresponding cavities may be formed laterally adjacent to the gate electrode structure in the active region and may be refilled with the silicon/germanium alloy which, when grown on the silicon material, may have an internal strained state, which in turn may induce a corresponding compressive strain component in the adjacent channel region. Consequently, a plurality of process strategies have been developed in the past in order to incorporate a highly strained silicon/germanium material in the drain and source areas of P-channel transistors.

In other approaches, the inferior controllability of the channel region of the short channel transistors caused by the continuous reduction of the critical dimensions of gate electrode structures has been addressed by an appropriate adaptation of the material composition of the gate dielectric material. To this end, it has been proposed that, for a physically appropriate thickness of a gate dielectric material, i.e., for reducing the gate leakage currents, a desired high capacitive coupling may be achieved by using appropriate material systems, which have a significantly higher dielectric constant compared to the conventionally used silicon dioxide-based materials. For example, dielectric materials including hafnium, zirconium, aluminum and the like may have a significantly higher dielectric constant and are, therefore, referred to as high-k dielectric materials, which are to be understood as materials having a dielectric constant of 10.0 or higher when measured in accordance with typical measurement techniques. As is well known, the electronic characteristics of the transistors also strongly depend on the work function of the gate electrode material, which in turn influences the band structure of the semiconductor material in the channel regions separated from the gate electrode material by the gate dielectric layer. In well-established polysilicon/silicon dioxide-based gate electrode structures, the corresponding threshold voltage, that is strongly influenced by the gate dielectric material and the adjacent electrode material, is adjusted by appropriately doping the polysilicon material in order to appropriately adjust the work function of the polysilicon material at the interface between the gate dielectric material and the electrode material. Similarly, in gate electrode structures including a high-k gate dielectric material, the work function has to be appropriately adjusted for N-channel transistors and P-channel transistors, respectively, which may require appropriately selected work function adjusting metal species, such as lanthanum for N-channel transistors and aluminum for P-channel transistors and the like. For this reason, corresponding metal-containing conductive materials may be positioned close to the high-k gate dielectric material in order to form an appropriately designed interface that results in the target work function of the gate electrode structure. In some conventional approaches, the work function adjustment is performed at a very late manufacturing stage, i.e., after any high temperature processes, after which a placeholder material of the gate electrode structures, such as polysilicon, is replaced by an appropriate work function adjusting species in combination with an electrode metal, such as aluminum and the like. In this case, however, very complex patterning and deposition process sequences are required in the context of gate electrode structures having critical dimensions of 50 nm and significantly less, which may result in severe variations of the resulting transistor characteristics.

Therefore, other process strategies have been proposed in which the work function adjusting materials may be applied in an early manufacturing stage, i.e., upon forming the gate electrode structures, wherein the metal species may be thermally stabilized and encapsulated in order to obtain the desired work function and thus threshold voltage of the transistors without being unduly influenced by the further processing. It turns out that, for many appropriate metal species and metal-containing electrode materials, an appropriate adaptation of the band gap of the channel semiconductor material may be required, for instance, in the P-channel transistors in order to appropriately set the work function thereof. For this reason, frequently, a so-called threshold adjusting semiconductor material, for instance in the form of a silicon/germanium mixture, is formed on the active regions of the P-channel transistors prior to forming the gate electrode structures, thereby obtaining the desired offset in the band gap of the channel semiconductor material. The electronic characteristics, and in particular the threshold voltage of the P-channel transistors, thus strongly depends on the characteristics of the silicon/germanium mixture, i.e., on the material composition and the layer thickness as well as on the uniformity of these parameters, so that complex selective epitaxial growth techniques are typically required in order to form the silicon/germanium mixture with uniform and predefined characteristics.

Consequently, in sophisticated semiconductor devices, a silicon/germanium material may have to be provided with precisely defined characteristics, for instance, as explained before for appropriately adjusting the band gap offset of the channel material, while, in other cases, additionally or alternatively, a silicon/germanium material may have to be provided as an embedded strain-inducing material, wherein the characteristics of the embedded semiconductor material may strongly affect performance of the transistors. Although these process techniques may provide significant advantages, for instance in view of reducing overall process complexity, for instance in view of replacement gate approaches or in view of enhancing overall performance, it turns out, however, that the material composition and layer thickness of an epitaxially grown silicon/germanium material may not be arbitrarily selected without significantly influencing the finally achieved transistor characteristics, as will be described in more detail with reference to FIGS. 1a-1e.

FIG. 1a schematically illustrates a cross-sectional view of a semiconductor device 100 in which a silicon/germanium material is to be provided in the channel area of one type of transistor on the basis of an epitaxial growth process. In the manufacturing stage shown, the device 100 comprises a substrate 101 and a silicon-based semiconductor layer 102, wherein the substrate 101 and the semiconductor layer 102 form a bulk configuration or an SOI (silicon-on-insulator) configuration, depending on the desired transistor architecture. For example, for an SOI configuration, a buried insulating layer (not shown) is formed below the semiconductor layer 102 and thus isolates the layer 102 with respect to the substrate 101. The semiconductor layer 102 further comprises isolation structures 102C, such as shallow trench isolations, which laterally delineate semiconductor regions or active regions, two of which, indicated as 102A, 102B, are illustrated in FIG. 1a. In the example shown, the active region 102A corresponds to the semiconductor region of a P-channel transistor, while the active region 102B corresponds to an N-channel transistor. An appropriate mask layer 103, such as a silicon dioxide material, may be formed on the active region 102B in order to act as a deposition mask for the selective epitaxial growth of a silicon/germanium material in the active region 102A. In some illustrative approaches, typically, a recess 102R is provided in the region 102A prior to actually depositing the silicon/germanium material.

The semiconductor device 100 as illustrated in FIG. 1a may be formed on the basis of the following processes. The isolation structure 102C may be formed by using sophisticated lithography, etch, deposition and planarization techniques, wherein, prior to or after forming the isolation structure 102C, appropriate well dopant species may be incorporated into the active regions 102A, 102B in order to define the basic transistor characteristics. To this end, any well-established implantation techniques and masking regimes may be applied. Thereafter, the mask 103 is formed, for instance by oxidation, deposition and the like, wherein a non-desired portion of the mask material is removed from above the active region 102A, for instance by applying a resist mask and performing any appropriate etch process. Furthermore, as illustrated, the recess 102R may be formed with an appropriate depth so as to obtain a desired surface topography after the deposition of the silicon/germanium material. Next, a selective epitaxial growth process is performed after any cleaning processes and the like in which process parameters are established in such a manner that a significant semiconductor material deposition is substantially restricted to exposed surface areas of the active region 102A, while any pronounced deposition on dielectric surface areas, such as the mask 103 and the isolation structure 102C, is suppressed. To this end, well-established chemical vapor deposition (CVD) techniques with process temperatures in the range of 650-750° C. have been developed on the basis of appropriately selected gas flow rates and process pressure, wherein the fraction of germanium in the silicon/germanium mixture may be set on the basis of controlling the corresponding gas flow rates. As previously explained, the resulting electronic characteristics, in particular the resulting threshold voltage, may significantly depend on the thickness of the silicon/germanium material and the material composition thereof, i.e., the germanium fraction contained therein. For example, a thickness of approximately 8-12 nm and a germanium content of up to twenty five percent may be used in order to obtain the required threshold voltage.

FIG. 1b schematically illustrates the semiconductor device 100 in a further advanced manufacturing stage. As illustrated, a silicon/germanium mixture or alloy 104 is formed in the active region 102A and thus represents a portion thereof, thereby providing the desired band gap offset, as discussed above. Furthermore, a gate electrode structure 160A of a P-channel transistor 150A is formed on the channel material 104 and may comprise a gate dielectric material 163A and a metal-containing electrode material 162A, followed by a further electrode material 161, such as silicon and the like. Furthermore, the materials 163A, 162A, 161 may be encapsulated by a spacer structure 165, for instance provided in the form of a silicon nitride material and the like, while a cap layer 164 may also be provided, for instance in the form of silicon dioxide, silicon nitride and the like. Similarly, a gate electrode structure 160B of an N-channel transistor 150B may be formed on the active region 102B and may have basically a similar configuration as the gate electrode structure 160A. That is, a gate dielectric material 163B in combination with a metal-containing electrode material 162B and the electrode material 161 may be provided in combination with the spacer structure 165 and the cap layer 164. It should be appreciated that the gate dielectric materials 163A, 163B may have basically the same configuration and may, however, differ in a work function adjusting species that may have been incorporated therein during the previous processing. For example, frequently, appropriate species may be diffused into the gate dielectric material in order to appropriately modify the characteristics thereof in view of achieving a desired overall work function and thus threshold voltage. Moreover, as discussed above, the gate dielectric layers 163A, 163B comprise a high-k dielectric material, such as hafnium oxide and the like, possibly in combination with a thin conventional dielectric material, for instance in the form of silicon oxynitride and the like, in view of superior interface characteristics. The metal-containing electrode materials 162A, 162B may have substantially the same composition or may also differ with respect to a work function adjusting species, depending on the overall process strategy applied for forming the gate electrode structures 160A, 160B.

A typical process flow for forming the semiconductor device 100 as illustrated in FIG. 1b may comprise the following processes. First, the basic material composition of the gate dielectric layers 163A, 163B may be provided, possibly in combination with any work function adjusting metal species and additional cap materials, such as titanium nitride and the like, and any appropriate treatment, such as anneal processes and the like, may be applied in order to adjust the overall characteristics of the gate dielectric materials 163A, 163B. Thereafter, the same or different materials may be deposited for the layers 162A, 162B, followed by the deposition of the material 161, for instance in the form of amorphous or polycrystalline silicon. Moreover, any further material, such as the cap material 164, is provided and the resulting layer stack is patterned on the basis of sophisticated lithography and etch techniques. Thereafter, the spacer structure 165 is formed by any appropriate deposition and etch strategy in order to confine, in particular, the sensitive materials 163A, 163B and 162A, 162B.

Consequently, by means of the channel material 104, an appropriate threshold voltage for the transistor 150A could, in principle, be obtained, wherein, however, significant defects have been observed in the material 104, as indicated by 104A, when the material 104 is provided with a thickness and material composition as specified above. For example, defect values of 200 000 and more defects per $cm^2$ have been identified upon performing corresponding defect etch experiments. However, corresponding defects in the channel region of the transistor 150A may result in significant variation of transistor characteristics or may even result in a non-acceptable transistor performance.

FIG. 1c schematically illustrates the semiconductor device 100 in a further advanced manufacturing stage. As shown, the transistor 150A comprises the gate electrode structure 160A, possibly with an additional spacer structure 166, which may include the spacer structure 165 (FIG. 1b). The spacer structure 166 may be used for defining the lateral and vertical dopant profile of drain and source regions 152. Similarly, the transistor 150B comprises the gate electrode structure 160B and corresponding drain and source regions 152 which, however, have an inverse conductivity type compared to the regions 152 of the transistor 150A. The transistors 150A, 150B may be formed on the basis of any appropriate process strategy for providing the spacer structure 166 and the drain and source regions 152. Thus, as illustrated, a channel region 151 comprising the silicon/germanium material 104 may have an inferior performance due to the high number of defects 104A, as discussed above. Basically, the defect rate could be reduced, for instance, by reducing the fraction of germanium material in the layer 104 and/or by reducing the thickness thereof which, however, in turn would result in significantly changed threshold voltages, which, however, may not be compatible with the overall design of the transistor 150A.

FIG. 1d schematically illustrates the device 100 according to other conventional strategies in which a strain-inducing silicon/germanium alloy is to be provided in the active region 102A, without affecting the active region 102B. As shown, cavities 105 are formed in the active region 102A laterally adjacent to the gate electrode structure 160A, which may have a similar configuration as previously described with reference to FIGS. 1b and 1c, while, in other cases, as illustrated, a more conventional configuration may be used, for instance in the form of a conventional dielectric material 163 and the like. It should be appreciated that, if desired, sophisticated gate materials may be provided in a later manufacturing stage.

The cavities 105 are typically formed on the basis of well-established plasma assisted etch recipes, possibly in combination with wet chemical etch processes by using the spacer structure 165 and the dielectric cap material 164 as an efficient etch mask. On the other hand, the active region 102B and the gate electrode structure 160B are covered by a spacer layer 165L, possibly in combination with a resist mask (not shown).

FIG. 1e schematically illustrates the semiconductor device 100 after forming a strain-inducing silicon/germanium material 109 in the active region 102A by applying a selective epitaxial growth technique, wherein a germanium concentration of twenty five atomic percent and higher may typically be used. Although the material 109 may represent a very efficient strain source in the active region 102A, it has been observed that also in this case significant crystal damage 109A is generated upon depositing the material 109 and during further processing.

Consequently, also in this case, performance of the corresponding transistor may be reduced and significant device variations may be introduced due to the incorporation of the strain-inducing semiconductor material 109.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices including P-channel transistors in which silicon/germanium may be provided on the basis of selective epitaxial growth techniques with a reduced defect rate compared to conventional process strategies. In illustrated aspects disclosed herein, the silicon/germanium material may be provided in the form of a threshold adjusting semiconductor material, for instance in sophisticated transistors including a high-k metal gate electrode structure, while, in other cases, in addition to providing a threshold adjusting silicon/germanium alloy, a strain-inducing material may also be embedded into the active region of the P-channel transistor.

It has been recognized that the incorporation of a carbon species, at least at the interface formed between the silicon/germanium alloy and the silicon base material of the active regions, may result in a significant reduction of the number of defects, thereby enabling the provision of a required layer thickness and germanium concentration, as is, for instance, required for appropriately setting the threshold voltage of sophisticated P-channel transistors. In some illustrative aspects disclosed herein, the carbon species may be provided on the basis of an implantation process, which may be controlled so as to also affect the N-channel transistor, which may thus result in superior strain conditions in the active region of the N-channel transistor.

One illustrative method disclosed herein comprises forming a crystalline silicon/germanium-containing material on a semiconductor material of an active region of a P-channel transistor. Additionally, the method comprises providing a carbon species at least at an interface formed between the crystalline silicon/germanium-containing material and the semiconductor material. Moreover, the method comprises forming a gate electrode structure on the crystalline silicon/germanium-containing material, wherein the gate electrode structure comprises a gate dielectric material separating an electrode material of the gate electrode structure from a channel region in the crystalline silicon/germanium-containing material. The method further comprises forming drain and source regions of the P-channel transistor in the active region.

A further illustrative method disclosed herein relates to forming a semiconductor device. The method comprises forming cavities in an active region of a transistor laterally adjacent to a gate electrode structure of the transistor. The method further comprises forming a strain-inducing semiconductor alloy in the cavities and providing a carbon species at least in a portion of an interface that is formed between the strain-inducing semiconductor alloy and a preserved portion of the active region. Additionally, the method comprises forming drain and source regions at least in the strain-inducing semiconductor alloy.

One illustrative P-channel transistor disclosed herein comprises an active region formed above a substrate and comprising a doped silicon base material and a silicon/germanium-containing material. The transistor further comprises a gate electrode structure formed on the silicon/germanium-containing material, wherein the gate electrode structure comprises a high-k dielectric material. The transistor further comprises a carbon species provided in the silicon/germanium-containing material. Moreover, drain and source regions are formed in the active region.

BRIEF DESCRIPTION OF THE DRAWINGS

The disclosure may be understood by reference to the following description taken in conjunction with the accompanying drawings, in which like reference numerals identify like elements, and in which.

Figure 1A:
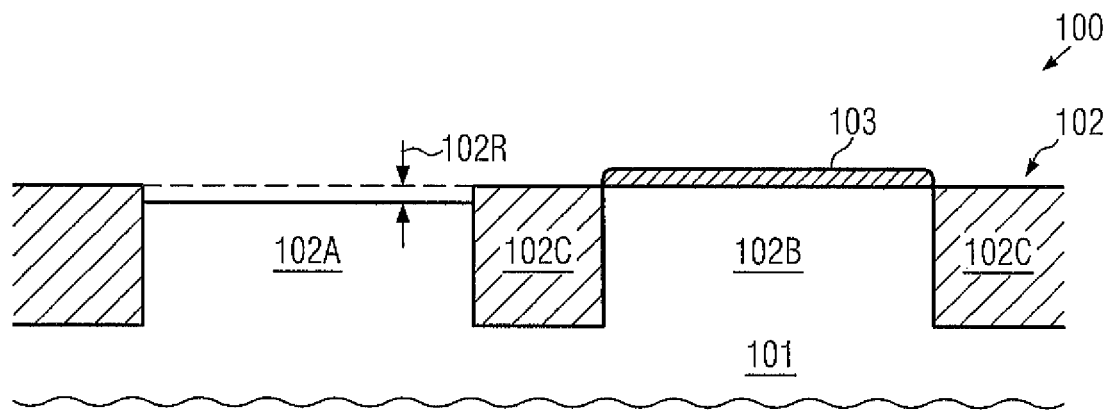
FIGS. 1a-1c schematically illustrate a sophisticated semiconductor device in which the threshold voltage of a P-channel transistor is adjusted in an early manufacturing stage on the basis of a silicon/germanium alloy, according to conventional strategies.
Figure 1B:
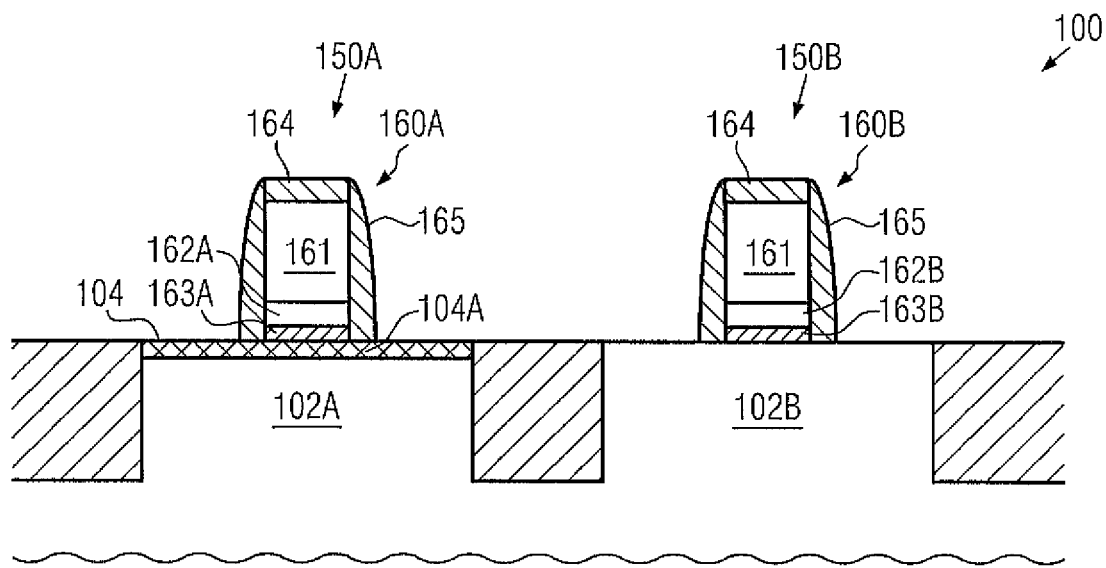
Figure 1C:
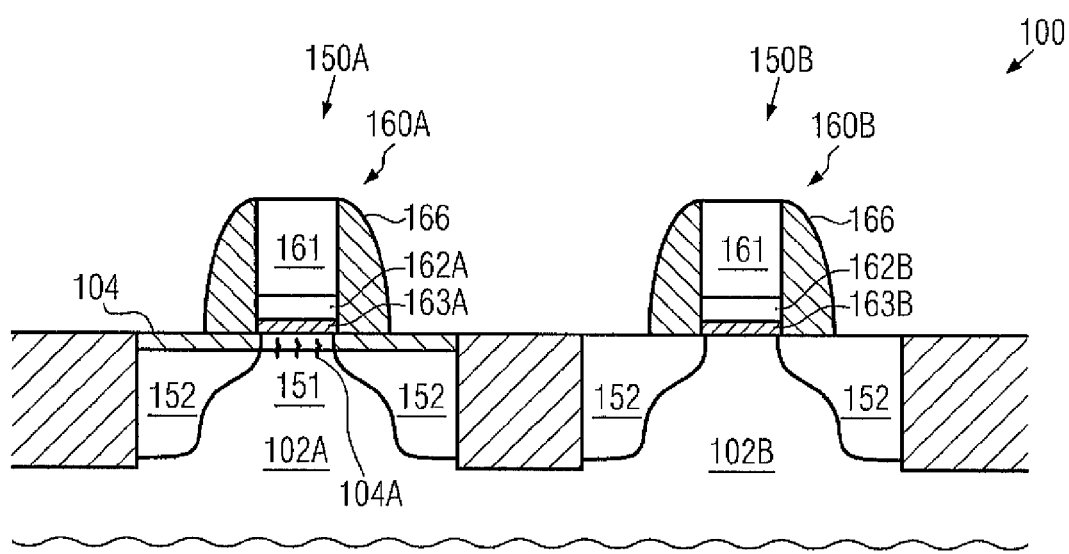
Figure 1D:
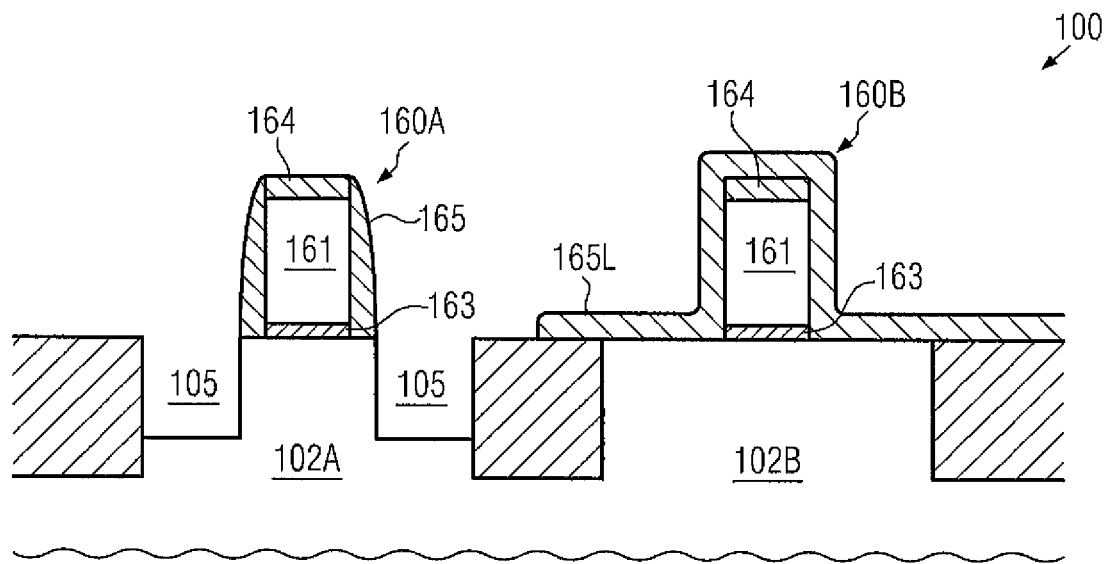
FIGS. 1d-1e schematically illustrate cross-sectional views of the semiconductor device in which a strain-inducing silicon/germanium alloy is incorporated into the active region, according to conventional strategies.
Figure 1E:
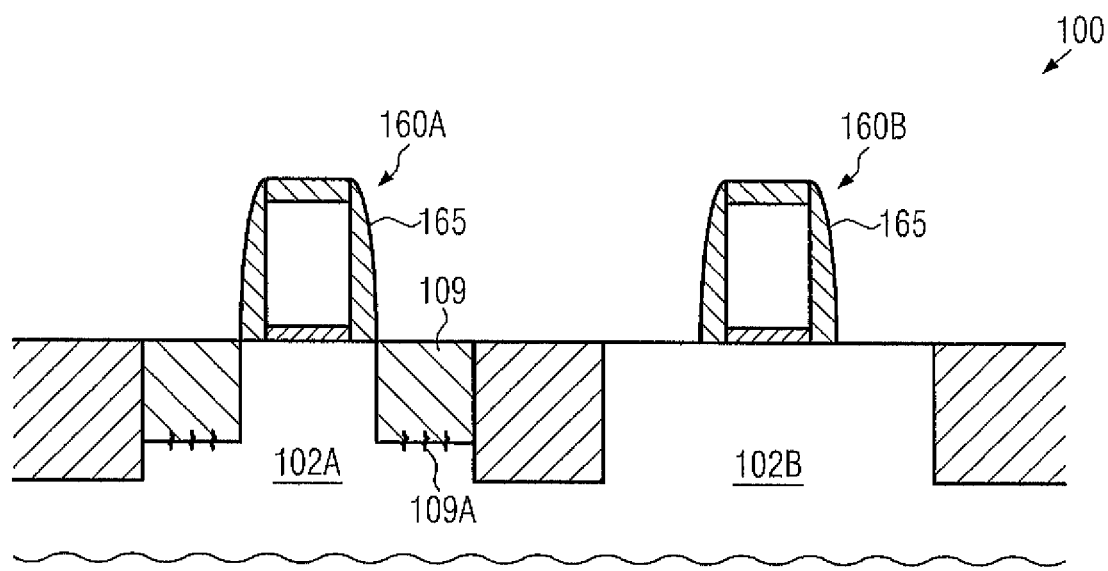

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which a semiconductor alloy, such as a silicon/germanium alloy, may be incorporated into the active region of transistors, such as P-channel transistors, with a reduced defect rate, which may be accomplished by providing a carbon species, at least at the interface between the silicon base material and the semiconductor alloy. It has surprisingly been recognized that incorporating a carbon species prior to or during the deposition of the semiconductor alloy, such as the silicon/germanium alloy, may result in a significantly reduced defect rate, which may be less by ten times or more compared to conventional process strategies, in which a silicon/germanium material may be deposited without the incorporation of a carbon species. Consequently, due to the significantly reduced defect rate, superior flexibility is achieved in selecting appropriate material characteristics, such as the thickness of a channel semiconductor material and the germanium concentration thereof, thereby efficiently enabling the adjustment of threshold voltages of sophisticated P-channel transistors. Consequently, high-k metal gate electrode structures, which are formed in an early manufacturing stage, may be formed on silicon/germanium materials having superior crystalline quality for a desired layer thickness and germanium concentration. In other illustrative embodiments disclosed herein, in addition to or alternatively to providing a silicon/germanium threshold adjusting semiconductor material, a strain-inducing mechanism on the basis of a silicon/germanium material may be provided with superior uniformity and enhanced efficiency, since, for a given germanium concentration, the reduced number of defects may result in superior electrical performance of the P-channel transistor, while, on the other hand, if required, even increased concentrations of germanium may be implemented, thereby obtaining a higher compressive strain in the channel region of the P-channel transistor. In some illustrative embodiments, the carbon species may be incorporated by ion implantation, wherein a certain amount of the carbon species may be incorporated near the surface of the active region of an N-channel transistor, which may result in an efficient regrowth of the material in the vicinity of a surface, for instance upon epitaxially growing the silicon/germanium material, thereby generating superior tensile strain in the N-channel transistor. Consequently, in this manner, performance of the P-channel transistor and the N-channel transistor may be concurrently improved on the basis of one additional non-masked implantation process.

With reference to FIGS. 2a-2j,k further illustrative embodiments will now be described in more detail, wherein, if required, reference may also be made to FIGS. 1a-1e.

Figure 2A:
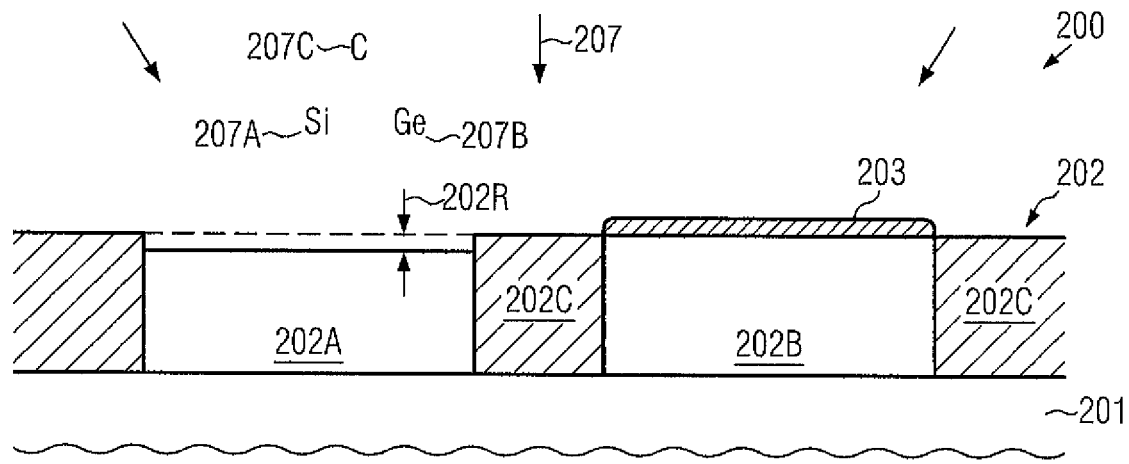
FIGS. 2a-2c schematically illustrate cross-sectional views of a semiconductor device during various manufacturing stages in which a silicon/germanium semiconductor alloy may be provided in an active region in an early manufacturing stage on the basis of a reduced defect rate by incorporating a carbon species and forming a P-channel transistor having superior performance, according to illustrative embodiments.

FIG. 2a schematically illustrates a cross-sectional view of a semiconductor device 200 comprising a substrate 201 and a semiconductor layer 202 formed thereabove. The semiconductor layer 202 may comprise isolation structures 202C for laterally delineating active regions 202A, 202B within the semiconductor layer 202.

It should be appreciated that with respect to these components of the semiconductor device 200, the same criteria may apply as previously explained with reference to the semiconductor device 100. In the manufacturing stage shown, the active region 202B may have formed thereon a mask 203, for instance in the form of silicon dioxide, silicon nitride and the like, while the active region 202A may be exposed. The active region 202A may correspond to a P-channel transistor while the active region 202B may represent the active region of an N-channel transistor. Furthermore, as illustrated, the active region 202A may be recessed, as indicated by 202R, if desired, while, in other cases, the recessing may be omitted when considered appropriate for the further processing of the device 200.

The semiconductor device 200 as illustrated in FIG. 2a may be formed on the basis of process techniques as are also described above with reference to the semiconductor device 100. Consequently, after masking the active region 202B and, if required, forming the recess 202R, the further processing may be continued by performing appropriate cleaning processes in order to prepare the active region 202A for the deposition of a silicon/germanium material having a desired composition and layer thickness. For example, a corresponding silicon/germanium material may be provided with material characteristics as previously specified with reference to the device 100. To this end, the device 200 may be exposed to a deposition atmosphere 207, which may be accomplished on the basis of well-established process recipes, wherein, contrary to conventional strategies, in addition to silicon and germanium-containing precursor materials, as indicated by 207A, 207B, a carbon species 207C may be added to the atmosphere 207. To this end, any appropriate precursor gas, as may for instance typically be used upon depositing a silicon carbide material and the like, may be added with an appropriate concentration, i.e., with appropriately selected gas flow rates for otherwise given process parameters. For example, the carbon species 207C may be added so as to obtain, in total, a carbon concentration of approximately 0.1 to several atomic percent with respect to the entire composition of the semiconductor material to be formed during the process 207, for example, 0.1 to 4 atomic percent. Thus, any well-established process recipes may be applied wherein additionally a desired fraction of the species 207C may be added.

Figure 2B:
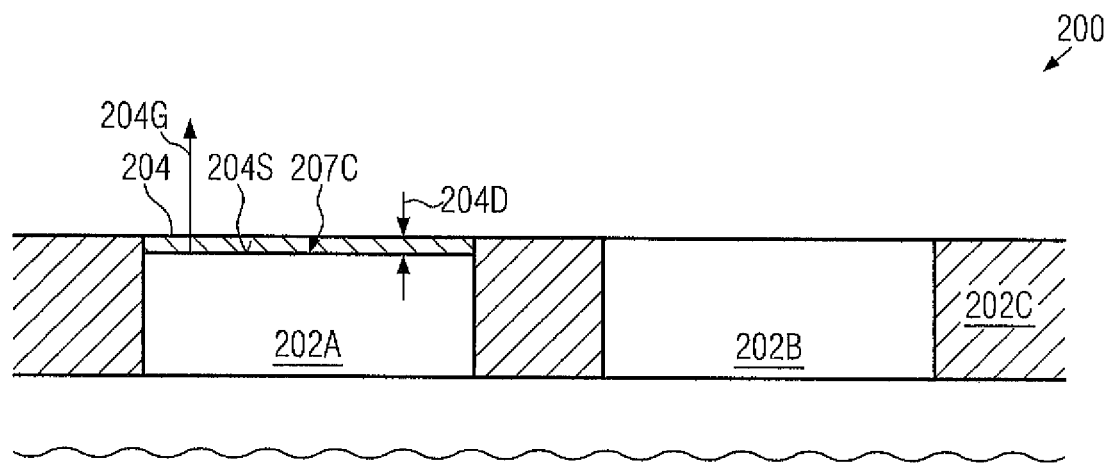

FIG. 2b schematically illustrates the device 200 in a further advanced manufacturing stage. As illustrated, a silicon/germanium-containing material layer 204 may be formed on the active region 202A and may thus now represent a part thereof. The layer 204 may have an appropriate thickness 204D and may include a germanium concentration of up to twenty five atomic percent in order to obtain the desired electronic characteristics, as is also previously discussed. The carbon species 207C may thus be provided at least at an interface 204S formed between the initial material of the active region 202A and the layer 204. It should be appreciated that carbon species may also diffuse into the active region 202A, since, typically, elevated temperatures of, for instance, above 700° C. may be applied for several minutes in order to form the material layer 204 by selective epitaxial growth. In some embodiments, the carbon species 207C may be provided in a graded profile with respect to the growth direction of the material 204, which may be accomplished by discontinuing or reducing the supply of the species 207C during the process 207 (FIG. 2a). In this case, the carbon concentration may drop from the interface 204S to a surface 204G of the layer 204.

After the deposition of the material layer 204, the mask 203 (FIG. 2a) may be removed on the basis of well-established selective etch recipes. Consequently, the further processing may be continued on the basis of the material layer 204, which may include a significantly reduced number of defects due to the incorporation of the carbon species 207C.

Figure 2C:
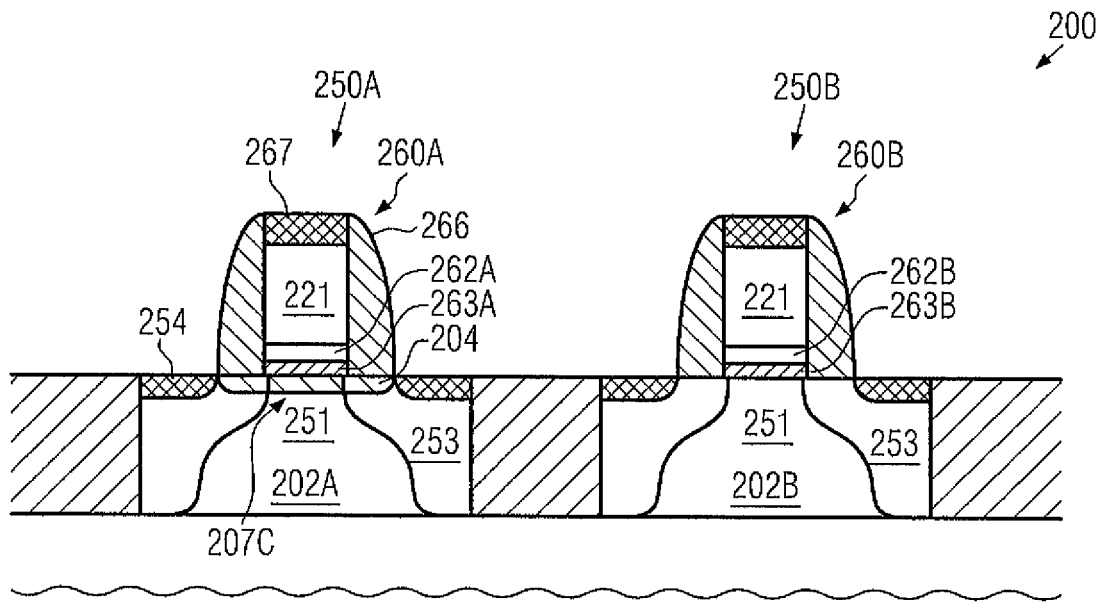

FIG. 2c schematically illustrates the semiconductor device 200 in a further advanced manufacturing stage. As illustrated, a transistor 250A, such as a P-channel transistor, may be formed in and above the active region 202A comprising the silicon/germanium layer 204, on which may be formed a gate electrode structure 260A. Similarly, a transistor 250B, such as an N-channel transistor, may be formed in and above the active region 202B and may comprise a gate electrode structure 260B. The gate electrode structures 260A, 260B may comprise an electrode material 221, possibly in combination with a further metal-containing portion 267, for instance in the form of a metal silicide when the material 221 comprises a significant fraction of silicon. Furthermore, a gate dielectric material 263A in combination with a metal-containing electrode material 262A may be provided in the gate electrode structure 260A, while a gate dielectric material 263B in combination with a metal-containing electrode material 262B may be provided in the gate electrode structure 260B. It should be appreciated that the materials 263A, 262A, 263B, 262B and 221 may have a similar configuration, as previously also described with reference to the semiconductor device 100. Moreover, the gate electrode structures 260A, 260B may comprise a spacer structure 266 in order to adjust the lateral and vertical dopant profile of drain and source regions 253. Furthermore, if required, metal silicide regions 254 may be provided in the drain and source regions 253.

The semiconductor device 200 as shown in FIG. 2c may be formed on the basis of any appropriate process strategies, as are also previously explained in order to provide the gate electrode structures 260A, 260B, starting from the configuration as shown in FIG. 2b, in the form of sophisticated high-k metal gate electrode structures. Similarly, the drain and source regions 253 may be formed on the basis of any appropriate process strategy, followed by the formation of the metal silicide regions 254, 267. Consequently, a channel region 251 of the transistor 250A may comprise a portion of the layer 204 and may provide superior transistor performance and device uniformity due to the reduced number of defects due to the presence of the carbon species 207C.

Figure 2D:
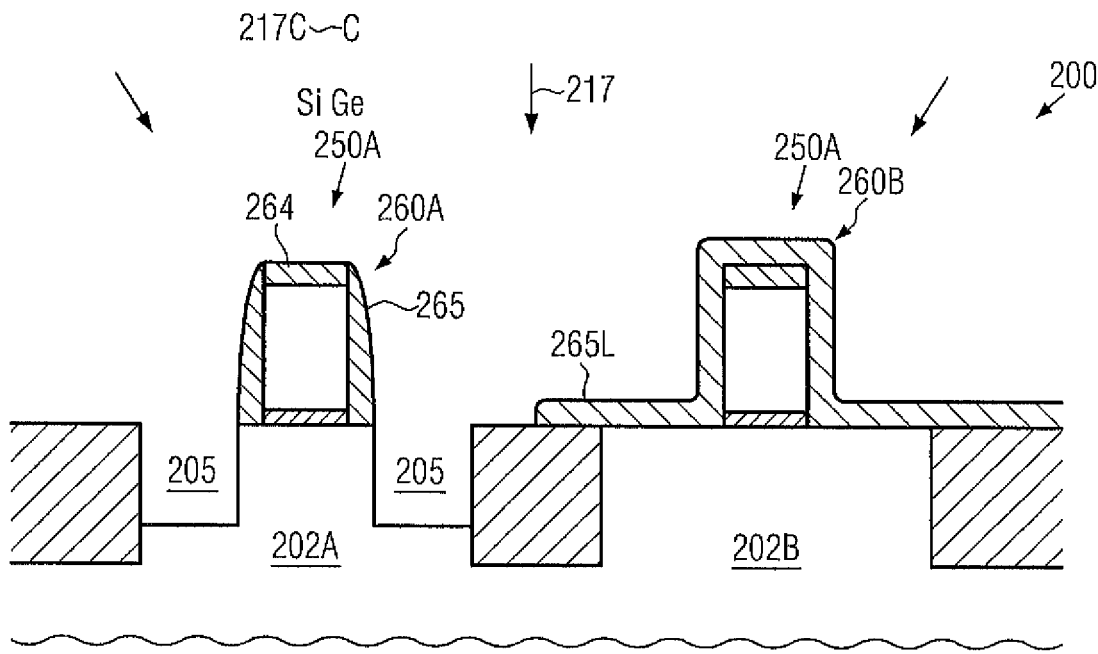
FIGS. 2d-2e schematically illustrate cross-sectional views of the semiconductor device according to illustrative embodiments in which a strain-inducing silicon/germanium material may be embedded into the active region on the basis of a carbon species in order to reduce the defect rate.

FIG. 2d schematically illustrates the semiconductor device 200 according to further illustrative embodiments in which a strain-inducing silicon/germanium material is to be embedded into the active region of the P-channel transistor. As illustrated, the gate electrode structures 260A, 260B may be provided and may have any appropriate configuration. For example, the gate electrode structure 260A may comprise a dielectric cap material 264 and a protective sidewall spacer structure 265. On the other hand, the gate electrode structure 260B of the transistor 250B may comprise the cap material 264, while a spacer layer 265L may still cover the active region 202B and the gate electrode structure 260B. Furthermore, cavities 205 may be formed in the active region 202A laterally adjacent to the gate electrode structure 260A. In this manufacturing stage, a selective epitaxial growth process 217 may be performed, wherein a carbon species 217C may be incorporated into the deposition atmosphere in order to reduce the number of defects upon depositing the silicon/germanium material. The process 217 may be performed on the basis of well-established process recipes, wherein, additionally, a certain amount of carbon may be incorporated, for instance with a percentage of 0.1 to several atomic percent, wherein, as also previously explained, the supply of the species 217C may be discontinued or reduced at any appropriate phase of the deposition process 217 in order to increasingly reduce the carbon concentration.

Figure 2E:
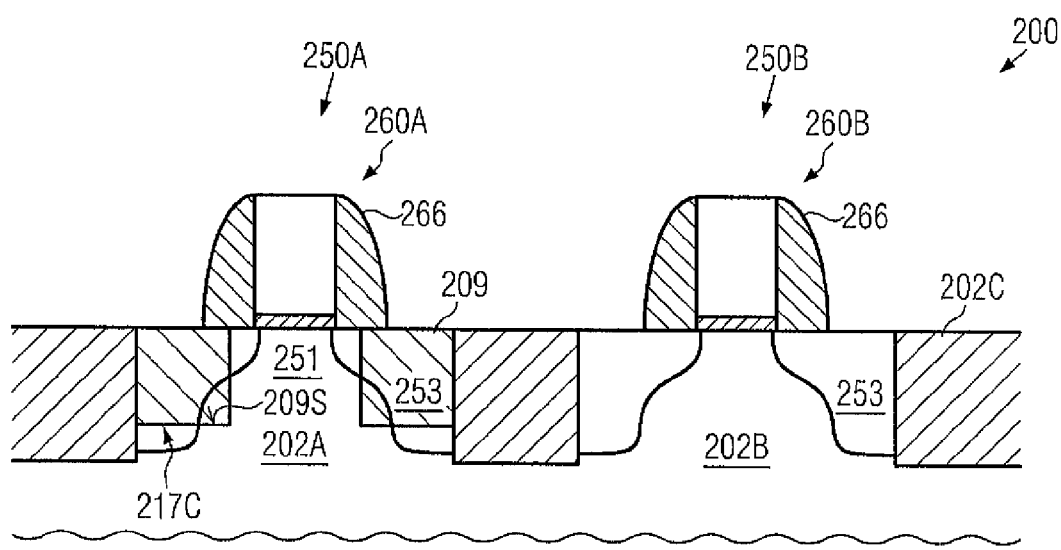

FIG. 2e schematically illustrates the semiconductor device 200 in a further advanced manufacturing stage. As shown, a silicon/germanium material 209 may be formed in the active region 202A and drain and source regions 253 may be provided, at least in a portion of the material 209. Due to the presence of the carbon species 217C, at least at a portion 209S of the interface between the material 209 and the preserved portion of the active region 202A, a significantly reduced number of defects may be present, thereby contributing to superior performance of the P-channel transistor 250A.

It should be appreciated that in some illustrative embodiments (not shown) the transistor 250A may also comprise the silicon/germanium-containing material layer 204 (FIG. 2c), if required for adjusting the overall transistor characteristics, as described above. In this case, the material 204 of FIG. 2c may be provided on the basis of the carbon species 207C providing the superior defect characteristics in the channel region 251, as discussed above.

Figure 2F:
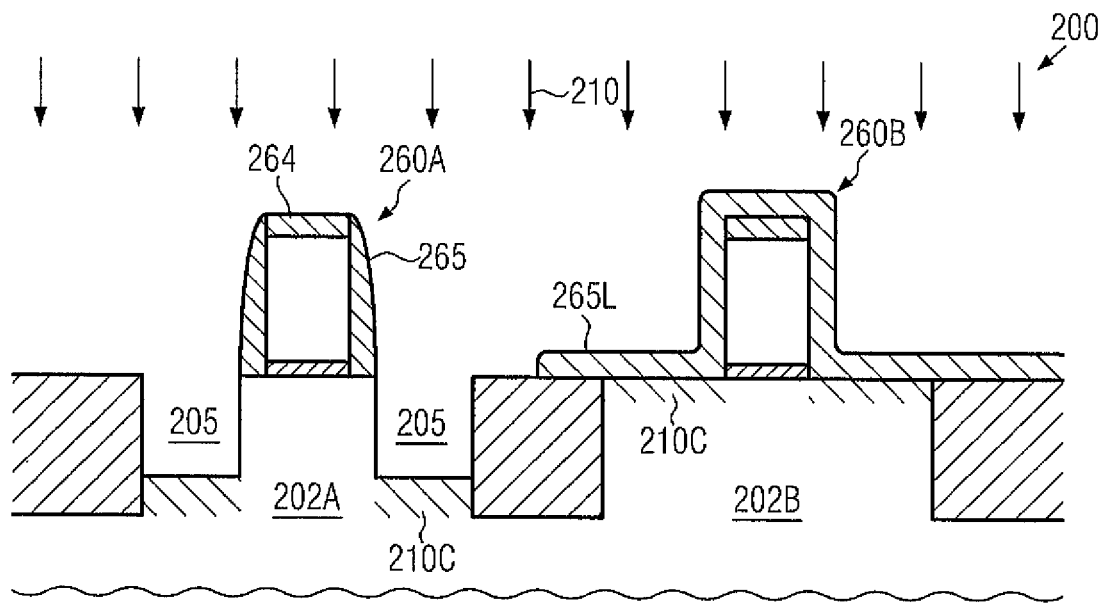
FIGS. 2f-2g schematically illustrate cross-sectional views of the semiconductor device wherein a carbon species may be incorporated into the active regions of transistors prior to the selective epitaxial growth of the silicon/germanium material, according to still further illustrative embodiments.

FIG. 2f schematically illustrates the device 200 according to further illustrative embodiments in which the device 200 may be exposed to an ion bombardment, i.e., an ion implantation process 210, in order to incorporate a carbon species 210C into the active region 202A at the bottom of the cavities 205. To this end, the implantation process 210 may be performed on the basis of any appropriate process parameters, such as dose and energy, in order to provide a desired carbon concentration and penetration depth at the bottom of the cavities 205. Appropriate implantation parameters may be readily determined on the basis of simulation, experiments and the like. In some illustrative embodiments, the implantation process 210 may be performed so as to incorporate a certain amount of the species 210C into the active region 202B through the spacer layer 265L. That is, the implantation energy may be appropriately selected so as to incorporate a desired fraction of the species 210C near the surface of the active region 202B. In this case, the incorporation of the species 210C may also result in a certain degree of amorphization of the active region 202B laterally adjacent to the gate electrode structure 260B. In other cases, if an increased degree of lattice damage may be required, a dedicated implantation process may be performed, for instance prior to forming the cavities 205, or after forming the cavities on the basis of an additional implantation mask, such as a resist mask. In still other illustrative embodiments, the spacer layer 265L may be provided in the form of a highly stressed dielectric material, such as a silicon nitride material having a high internal tensile stress, which may be accomplished by selecting appropriate deposition parameters in accordance with well-established strategies.

Figure 2G:
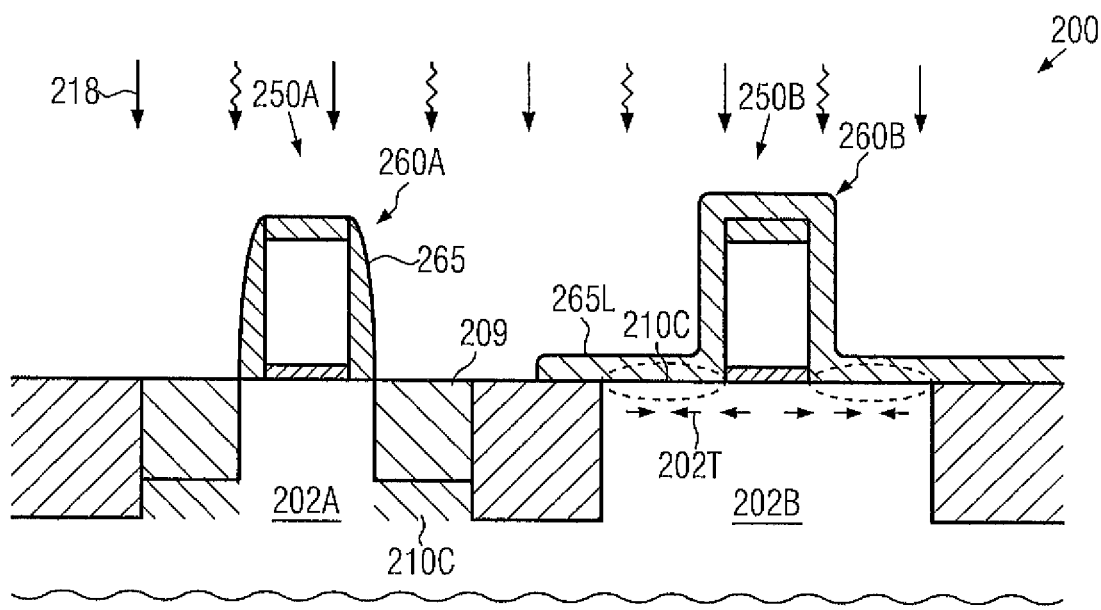

FIG. 2g schematically illustrates the device 200 in a further advanced manufacturing stage. As illustrated, a selective epitaxial growth process 218 may be performed on the basis of well-established process recipes, thereby forming the silicon/germanium material 209 in the active region 202A, which may comprise the previously incorporated carbon species 210C. Typically, the deposition process 218 may involve elevated temperatures, for instance above approximately 700° C., for a time interval of up to several minutes, for example five minutes and more, thereby initiating a significant re-crystallization in the active region 202B, which may finally result in a tensile strain component, indicated by 202T, due to the presence of the carbon species 210C. It should be appreciated that if a significant degree of amorphization may have been created in the active region 202B prior to depositing the spacer layer 265L, a significant degree of "stress memorization" may occur upon re-crystallizing any amorphized portion in the region 202B due to the presence of the layer 265L, which may act as a rigid overlayer, thereby forcing the re-crystallization to take place in a strained state.

Consequently, resulting strain may be further increased, while, in some cases, even a highly internal tensile strain in the layer 265L, if provided, may further enhance the overall strain-inducing mechanism for the transistor 250B.

On the other hand, the material 209 may be efficiently deposited without inducing undue defects due to the presence of the carbon species 210C. It should be appreciated that the process 218 may include any appropriate "pre-anneal" phase in order to re-crystallize exposed surface portions of the active region 202A, which may possibly be damaged during the preceding implantation process 210 (FIG. 2f). Consequently, the material 209 may be deposited on the basis of a high quality of the crystal structure of the base material in the region 202A.

Thereafter, the further processing may be continued by removing the spacer layer 265L, thereby nevertheless preserving a significant fraction of the tensile strain component, and forming drain and source regions, as also described above.

It should be appreciated that also in this case the manufacturing flow as described with reference to FIGS. 2f and 2g may be combined with the process of forming the layer 204 (FIG. 2c), as described above.

Figure 2H:
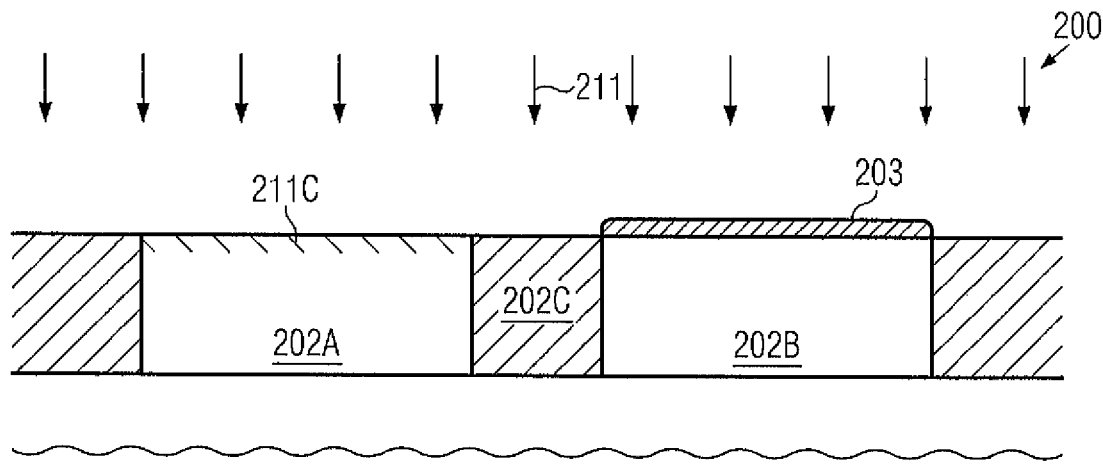
FIGS. 2h-2j schematically illustrate cross-sectional views of the semiconductor device during various manufacturing stages in which a channel silicon/germanium material may be provided, wherein a carbon species may be incorporated prior to actually depositing the channel semiconductor material, according to still further illustrative embodiments.

FIG. 2h schematically illustrates the semiconductor device 200 in an early manufacturing stage according to still further illustrative embodiments in which a threshold adjusting silicon/germanium material is to be formed in the active region 202A, which may be accomplished by incorporating a carbon species 211C on the basis of ion bombardment 211, such as an implantation process. As illustrated, during the implantation process 211, the species 211C may be incorporated into the active region 202A, while the mask 203 formed on the active region 202B may substantially block the incorporation of the species 211C. To this end, if required, the thickness and material composition of the mask 203 may be appropriately adapted. Consequently, any additional lithography process for incorporating the species 211C in the active region 202A may be avoided. In other cases, a dedicated implantation mask may be provided, if considered appropriate.

Figure 2I:
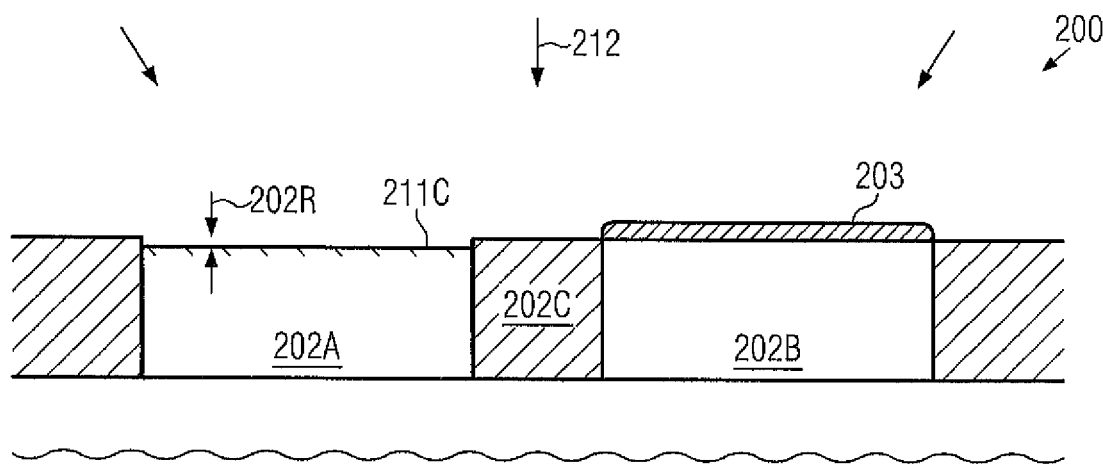

FIG. 2i schematically illustrates the device 200 during an etch process 212 for removing a portion of the active region 202A so as to provide the recess 202R. In the embodiment shown, the etch process 212 may be performed after the incorporation of the species 211C, which may result in superior etch conditions, for instance due to a certain degree of amorphization, thereby providing a very uniform etch rate across the entire active region 202A.

Figure 2J:
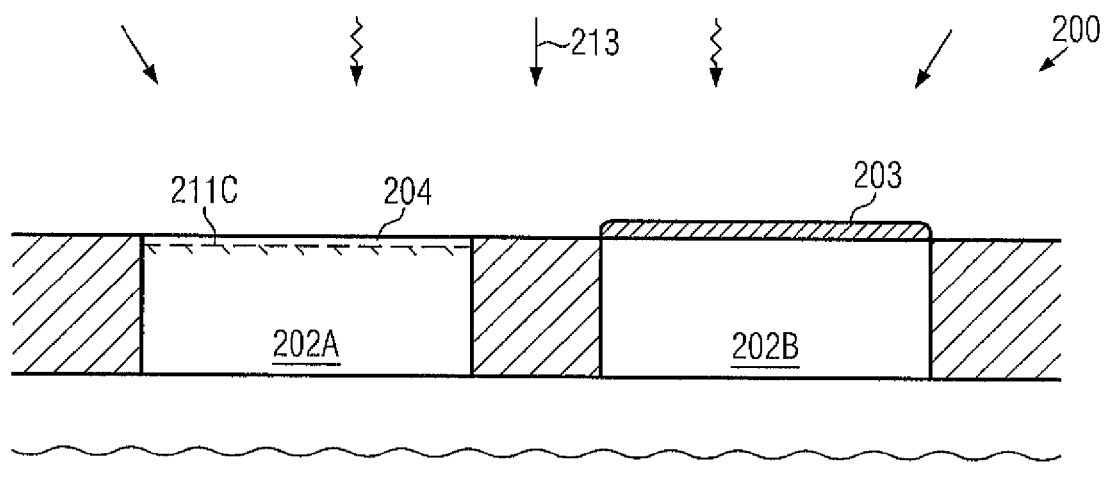

FIG. 2j schematically illustrates the device 200 in a further advanced manufacturing stage in which a process 213 may be performed so as to deposit the silicon/germanium-containing material layer 204. To this end, the process 213 may also comprise any appropriate pre-anneal phase so as to re-crystallize implantation-induced damage, if considered appropriate. Thereafter, during the actual deposition phase, the silicon/germanium material may be provided on the basis of any appropriate composition and with a desired layer thickness, wherein, nevertheless, the remaining portion of the species 211C may still provide superior growth conditions and thus a reduction of the resulting defects.

Thereafter, the further processing may be continued, for instance as described with reference to FIG. 2c, for instance by forming sophisticated high-k metal gate electrode structures. In other illustrative embodiments, the further processing may be continued as is described with reference to FIGS. 2d and 2e, or with reference to FIGS. 2f and 2g, if an additional strain-inducing silicon/germanium material is to be implemented into the active region 202A. In other cases, a standard conventional process strategy for incorporating a strain-inducing semiconductor alloy may be applied.

As a result, the present disclosure provides semiconductor devices and manufacturing techniques in which the incorporation of a carbon species prior to or during the selective epitaxial growth of a silicon/germanium material may significantly reduce the defect rate in the active region of the P-channel transistor. In this manner, superior flexibility in selecting appropriate material parameters, such as germanium concentration and thickness of a threshold adjusting semiconductor material or germanium concentration in a strain-inducing semiconductor material, may be achieved. In some illustrative embodiments, concurrently performance of N-channel transistors may be enhanced by creating an increased tensile strain on the basis of the carbon species.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
recessing an active region of a P-channel transistor;
forming a layer of crystalline silicon/germanium alloy material in said recess and on a semiconductor material of said active region;
providing a carbon species at least at an interface formed between said layer of crystalline silicon/germanium alloy material and said semiconductor material, wherein said provided carbon species is incorporated into said active region prior to recessing said active region;
forming a gate electrode structure on said layer of crystalline silicon/germanium alloy material, said gate electrode structure comprising a gate dielectric material separating an electrode material of said gate electrode structure from a channel region in said layer of crystalline silicon/germanium alloy material, wherein said gate dielectric material is formed on and in direct contact with an upper surface of said layer of crystalline silicon/germanium alloy material; and
forming drain and source regions of said P-channel transistor in said active region.

2. The method of claim 1, wherein providing said carbon species comprises incorporating said carbon species into a deposition atmosphere used for depositing said layer of crystalline silicon/germanium alloy material.

3. The method of claim 1, wherein providing said carbon species comprises performing an implantation process prior to forming said layer of crystalline silicon/germanium alloy material.

4. The method of claim 1, wherein a concentration of said carbon species in said layer of crystalline silicon/germanium alloy material is 1 atomic percent or less.

5. The method of claim 1, further comprising forming a strain-inducing semiconductor alloy in said semiconductor region after forming said gate electrode structure.

6. The method of claim 5, further comprising providing a further carbon species at least at a portion of a second interface that is formed between said strain-inducing semiconductor alloy and the semiconductor material of said active region.

7. The method of claim 6, wherein said further carbon species is provided by performing an implantation process.

8. The method of claim 6, wherein said further carbon species is provided upon depositing said strain-inducing semiconductor alloy.

9. The method of claim 5, wherein said strain-inducing semiconductor material is comprised of silicon and germanium.

10. The method of claim 1, wherein forming said gate electrode structure comprises forming said gate dielectric material so as to include a high-k dielectric material and forming a metal-containing material on said gate dielectric material.

11. A method of forming a semiconductor device, the method comprising:
   forming cavities in an active region of a P-channel transistor laterally adjacent to a gate electrode structure of said transistor;
   forming a strain-inducing semiconductor alloy in said cavities, wherein said strain-inducing semiconductor alloy comprises a carbon species having a first carbon species concentration proximate an interface formed between said strain-inducing semiconductor alloy and a preserved portion of said active region and a second carbon species concentration proximate an upper surface of said strain-inducing semiconductor alloy that is less than said first carbon species concentration;
   providing a further carbon species at least in a preserved portion of said active region proximate said interface; and
   forming drain and source regions at least in said strain-inducing semiconductor alloy.

12. The method of claim 11, wherein forming said cavities comprises dielectrically encapsulating said gate electrode structure and performing a selective etch process while masking a second gate electrode and a second active region of a second transistor by a mask layer.

13. The method of claim 12, wherein providing said further carbon species comprises performing an implantation process so as to incorporate said further carbon species into at least said preserved portion of said active region and into a portion of said second active region through said mask layer.

14. The method of claim 13, wherein said implantation process is performed after forming said cavities.

15. The method of claim 12, wherein said masking layer is formed so as to have an internal tensile stress.

16. The method of claim 11, further comprising, prior to forming said cavities, forming said gate electrode structure so as to comprise a high-k dielectric material in a gate insulation layer.

17. The method of claim 11, further comprising forming a silicon/germanium alloy material layer on said active region and incorporating a carbon species into said silicon/germanium alloy material layer, wherein a gate dielectric layer of said gate electrode structure is formed on and in direct contact with an upper surface of said silicon/germanium alloy material layer after incorporating said carbon species.

18. A P-channel transistor, comprising:
   an active region positioned above a substrate, said active region comprising a doped silicon base material and a layer of silicon/germanium alloy material;
   a gate electrode structure positioned on said layer of silicon/germanium alloy material, said gate electrode structure comprising a gate dielectric layer that is positioned on and in direct contact with an upper surface of said layer of silicon/germanium alloy material, said gate dielectric layer comprising a high-k dielectric material;
   a carbon species provided in said silicon/germanium-containing material; and
   drain and source regions formed in said active region.

19. The P-channel transistor of claim 18, further comprising a strain-inducing semiconductor alloy formed in said active region and a further carbon species formed below said strain-inducing semiconductor alloy.

20. The P-channel transistor of claim 18, wherein said carbon species in said layer of silicon/germanium alloy material has a first concentration proximate an interface between said layer of silicon/germanium alloy material and said doped silicon base material and a second concentration proximate an upper surface of said layer of silicon/germanium alloy material that is less than said first concentration.

21. The P-channel transistor of claim 20, wherein said carbon species provided in said layer of silicon/germanium alloy material has a graded concentration profile between said first and second concentrations.

22. A method, comprising:
   incorporating a carbon species into a semiconductor material of an active region of a P-channel transistor;
   after incorporating said carbon species, forming a recess in said semiconductor material;
   forming a crystalline silicon/germanium-containing material in said recess and on said semiconductor material, said carbon species remaining at least at an interface formed between said crystalline silicon/germanium-containing material and said semiconductor material;
   forming a gate electrode structure on said crystalline silicon/germanium-containing material, said gate electrode structure comprising a gate dielectric material separating an electrode material of said gate electrode structure from a channel region in said crystalline silicon/germanium-containing material; and
   forming drain and source regions of said P-channel transistor in said active region.

* * * * *